(12) United States Patent
Beck

(10) Patent No.: US 10,295,640 B2
(45) Date of Patent: May 21, 2019

(54) METHOD AND APPARATUS FOR MOVEMENT CORRECTION OF MAGNETIC RESONANCE MEASUREMENT DATA

(71) Applicant: Siemens Healthcare GmbH, Erlangen (DE)

(72) Inventor: Thomas Beck, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 311 days.

(21) Appl. No.: 15/271,675

(22) Filed: Sep. 21, 2016

(65) Prior Publication Data

US 2017/0082718 A1 Mar. 23, 2017

(30) Foreign Application Priority Data

Sep. 21, 2015 (DE) .................. 10 2015 218 106

(51) Int. Cl.
*G01R 33/48* (2006.01)
*G01R 33/483* (2006.01)
*G01R 33/565* (2006.01)

(52) U.S. Cl.
CPC ... *G01R 33/56509* (2013.01); *G01R 33/4818* (2013.01); *G01R 33/4835* (2013.01)

(58) Field of Classification Search
CPC .......... G01R 33/4835; G01R 33/56509; G01R 33/5608; G01R 33/4833
USPC ................................................ 324/309, 318
See application file for complete search history.

(56) References Cited

U.S. PATENT DOCUMENTS

| | | |
|---|---|---|
| 2006/0226836 A1 | 10/2006 | Shu et al. |
| 2006/0244445 A1 | 11/2006 | Sussman et al. |
| 2008/0054899 A1 | 3/2008 | Aksoy et al. |
| 2011/0105884 A1* | 5/2011 | Beck .................... G01R 33/561 600/410 |
| 2012/0243756 A1 | 9/2012 | Samsonov et al. |

OTHER PUBLICATIONS

Tisdall et al., "MPRAGE Using EPI Navigators for Prospective Motion Correction," Proc. Intl. Soc. Mag. Reson. Med. 17 (2009).
Breuer et al., "Controlled Aliasing in Parallel Imaging Results in Higher Acceleration (CAIPIRINHA) for Multi-Slice Imaging," Magnetic Resonance in Medicine, vol. 53, No. 3, pp. 684-691 (2005).
Thesen, "Restropective and Prospective Methods for Image-Based Correction of Patient Head Motions in Neuro-Functional Magnetic Resonance Tomography in Real-Time," Doctorial Dissertation, Ruprecht-Karls-Universität, Heidelberg, Germany, 2001 (abstract and English translation).

(Continued)

*Primary Examiner* — Amy He
(74) *Attorney, Agent, or Firm* — Schiff Hardin LLP

(57) ABSTRACT

In a method and magnetic resonance apparatus for generating motion-corrected magnetic resonance measurement data, reference data and measurement data are acquired from multiple sub-regions of an examination region of a subject, and first and second items of movement information are respectively generated for the respective sub-regions, and motion-corrected data for the respective sub-regions is generated by transforming k-space data using the first and second items of movement information.

18 Claims, 6 Drawing Sheets

(56) References Cited

OTHER PUBLICATIONS

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Thesen, "Prospective Acquisition Correction for Head Motion With Image-Based Tracking for Real-Time fMRI," Magnetic Resonance in Medicine, vol. 44, pp. 457-465 (2000).
Atkinson et al., "Reconstruction After Rotational Motion," Magnetic Resonance in Medicine, vol. 49, pp. 183-187 (2003).
Lin et al., "Extrapolation and Correlation (EXTRACT): A New Method for Motion Compensation in MRI," IEEE Transactions on Medical Imaging, vol. 28, pp. 82-93 (2009).

* cited by examiner

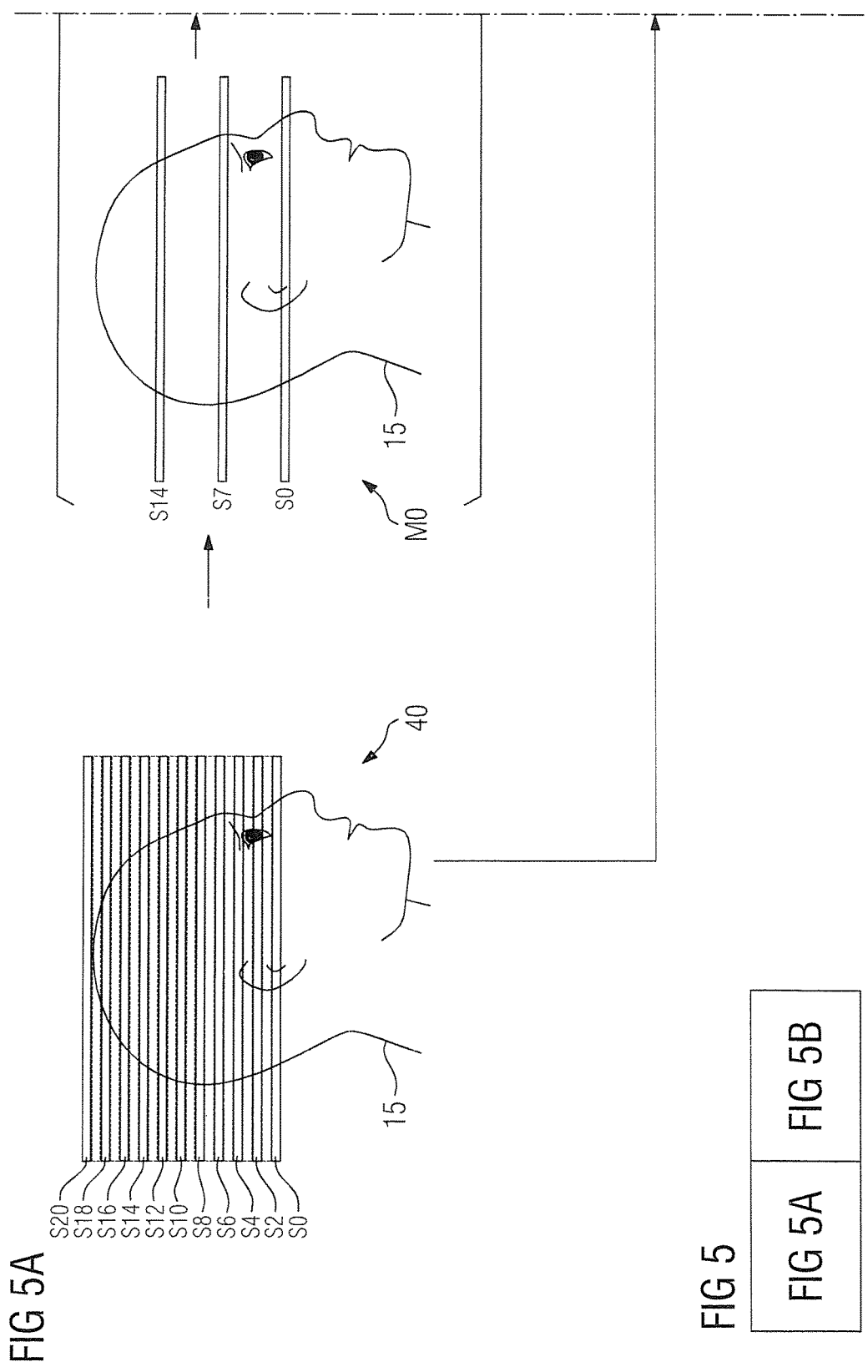

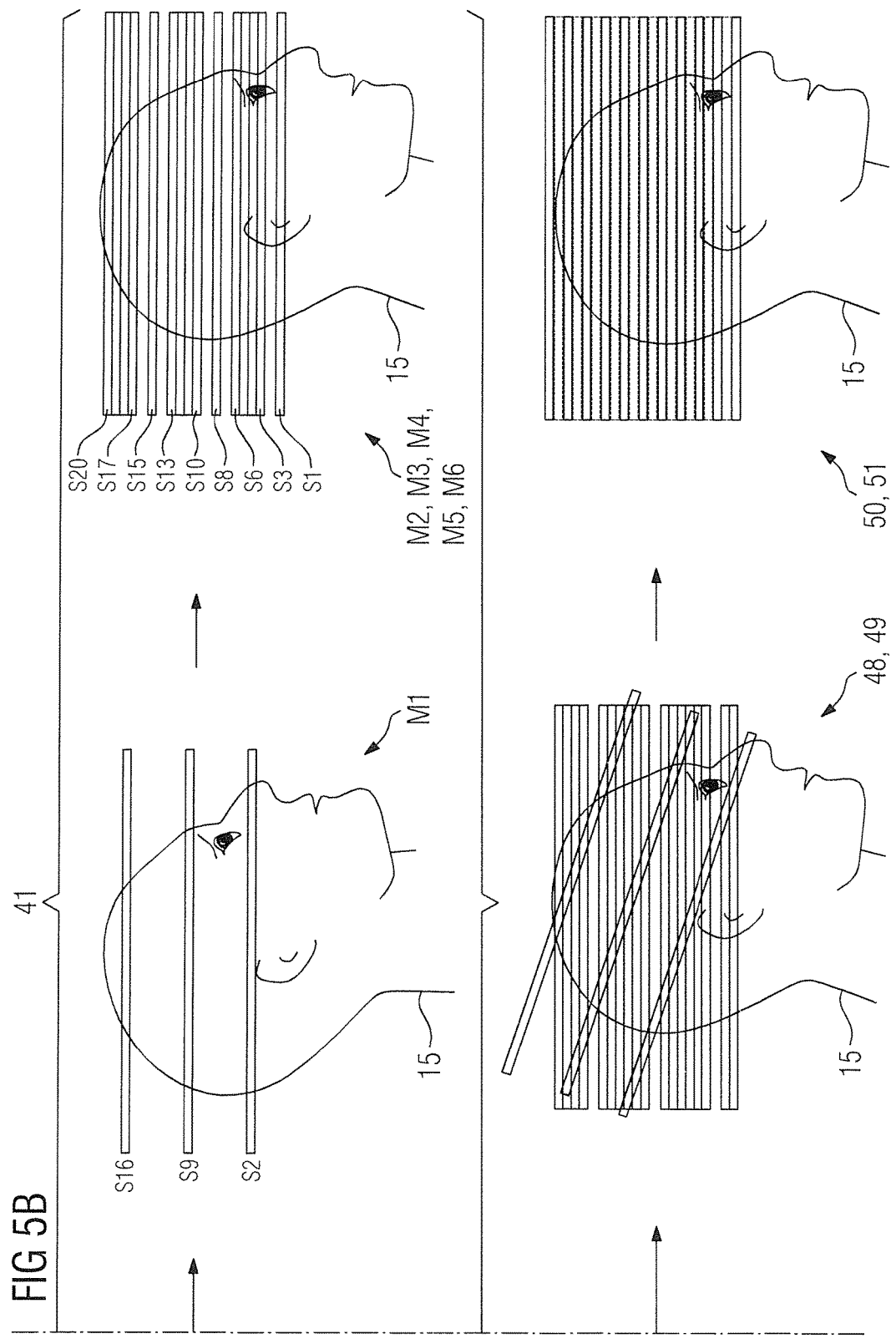

METHOD AND APPARATUS FOR MOVEMENT CORRECTION OF MAGNETIC RESONANCE MEASUREMENT DATA

BACKGROUND OF THE INVENTION

Field of the Invention

The invention concerns a method for movement correction of magnetic resonance measurement data, as well as a magnetic resonance apparatus and a storage medium encoded with program code for implementing such a method.

Description of the Prior Art

In a magnetic resonance apparatus, also called a magnetic resonance tomography system, a subject to be examined, in particular a patient, is exposed with the use of a basic field magnet to a high basic magnetic field, for example 1.5 or 3 or 7 tesla. In addition, gradient pulses are emitted by a gradient coil arrangement. Radio-frequency pulses, for example excitation pulses, are then emitted via a radio-frequency antenna unit by suitable antenna arrangements, which cause nuclear spins of specific atoms that are excited resonantly by these radio-frequency pulses to be flipped by a defined flip angle in relation to the magnetic field lines of the basic magnetic field lines of the basic magnetic field. During relaxation of the nuclear spins, radio-frequency signals, called magnetic resonance signals, are emitted and then received by suitable radio-frequency antennas, and then further processed. The desired image data can be reconstructed from the raw data acquired in this manner.

For a specific measurement, a specific magnetic resonance sequence, also called a pulse sequence, is transmitted, which is composed of a sequence of radio-frequency pulses, for example excitation pulses and refocusing pulses, and gradient pulses that are suitably coordinated thereto, in different gradient axes along different spatial directions. Chronologically coordinated therewith, read-out windows are set that pre-specify the periods of time in which the induced magnetic induced magnetic resonance signals are acquired.

During magnetic resonance imaging, movement of the object under examination may occur. For example, a respiratory movement and/or cardiac movement of the object under examination may occur. It is also possible for arbitrary movements of limbs of the object under examination to occur. This movement of the object under examination can result in an unwanted change to the magnetic resonance measurement data acquired during the magnetic resonance imaging. For example, the occurrence of movement artifacts in the acquired magnetic resonance measurement data is conceivable. The movement can also reduce the quality of the acquired magnetic resonance measurement data.

It is particularly during magnetic resonance imaging that the movement of the object under examination can have a considerable influence on the measured magnetic resonance measurement data. This is because, in dependence upon the magnetic resonance sequence used, the recording of the magnetic resonance measurement data can require a longer time period of up to several minutes. It is also possible for a time series to be recorded during the magnetic resonance imaging. This means that the same two-dimensional or three-dimensional examination region is recorded multiple times at different time points one after the other. This can result in the depiction of a temporal change to a section of the anatomy of the object under examination in the magnetic resonance measurement data acquired in this way. A possible movement of the object under examination during the acquisition of the time series can complicate or impair the evaluation of the time series since, when the image position is kept constant during the acquisition of the time series, the movement causes the depicted anatomy of the object under examination to change over the time series.

Different methods are known for at least partial compensation of the movement of the object under examination during the acquisition of the magnetic resonance image data. One known method for at least partial compensation of the movement of the object under examination is prospective movement correction. In this context, prospective movement correction generally involves the detection and correction of a movement of the object under examination during the acquisition of the magnetic resonance measurement data. This enables the acquisition of the magnetic resonance measurement data to be adapted to the movement of the object under examination during the actual magnetic resonance imaging. For example, image-based navigators can be used to detect the movement of the object under examination during the acquisition of the magnetic resonance measurement data.

A further known method is retrospective movement correction, which typically compensates the movement of the object under examination in the magnetic resonance measurement data following the acquisition of the magnetic resonance measurement data. In this context, the magnetic resonance measurement data itself can be used for the movement correction of the magnetic resonance measurement data.

SUMMARY OF THE INVENTION

An object of the invention is to enable improved movement correction of acquired magnetic resonance measurement data.

The method according to the invention for movement correction of magnetic resonance measurement data acquired during magnetic resonance imaging of an object under examination by means of a magnetic resonance device includes the following steps.

A reference measurement performed at a first point in time during the magnetic resonance imaging, whereby a reference region is acquired.

A diagnostic image measurement is implemented at a time after the first point in time during the magnetic resonance imaging, wherein magnetic resonance measurement data are acquired from a number of sub-regions of an examination region.

A first item of movement information is determined in a computer from the reference region and a first set of magnetic resonance measurement data, which is acquired from a first sub-region of the number of sub-regions.

A second item of movement information is determined in the computer from the reference region and a second set of magnetic resonance measurement data, which is acquired from a second sub-region of the number of sub-regions.

A first k-space data set representing the first set of magnetic resonance measurement data is obtained by implementing a transformation using the first item of movement information.

A second k-space data set representing the second set of magnetic resonance measurement data is obtained by implementing another transformation using the second item of movement information.

A combination of the first transformed k-space data set and the second transformed k-space data set is converted into an image data set, whereby movement-corrected magnetic resonance image data are generated.

The movement-corrected magnetic resonance image data are provided in electronic form from the computer.

The object under examination can be a patient, a training volunteer, an animal or a phantom. The movement-corrected magnetic resonance measurement data can be displayed and/or stored. In the present case, the magnetic resonance imaging involves the use of a magnetic resonance sequence for the acquisition of the magnetic resonance measurement data. The reference measurement and the image measurement are then part of the magnetic resonance sequence. The first point in time at which the reference measurement is performed can be a starting point in time of the reference measurement. The first point in time lies in an initial time period of the magnetic resonance sequence, advantageously before magnetic resonance measurement data are acquired according to the magnetic resonance sequence. The first point in time can be the time of the start of the magnetic resonance sequence. The point in time at which the image measurement is performed can be at a time after the first point in time.

The reference region acquired during the reference measurement can be a two-dimensional reference slice or a three-dimensional reference volume. In the majority of cases, only one reference measurement is performed in order to acquire exactly one reference region at the first point in time. It is also conceivable for a number of reference regions to be acquired, for example at a number of first points in time. The reference region can also be formed as any suitable combination of two or more measurements, for example as the average over these two or more measurements. The reference region can then be used as the basis for the movement correction for the entire magnetic resonance imaging or the entire magnetic resonance sequence. The first point in time can then be treated as a reference point in time, which can be used as a reference for a subsequently detected movement of the object under examination. However, in certain cases it is conceivable for the reference measurement to be repeated again during the magnetic resonance imaging, i.e. for a further reference region to be acquired at a further first point in time during the magnetic resonance sequence. The reference region can be used solely as the basis for the movement correction or made available. The reference region acquired during the reference measurement can also represent part of the diagnostic magnetic resonance measurement data. This, for example, enables the magnetic resonance measurement data to be acquired in a time series, wherein the reference measurement represents a first acquisition of the examination region at the first point in time and the image measurement represent a further acquisition of the examination region at the second point in time. This, for example, enables the acquisition of the examination region at the start of a time series, in particular the first acquisition of the examination region in the time series, to be used as a reference region for the movement correction.

The magnetic resonance measurement data acquired during the image measurement represent diagnostic magnetic resonance measurement data. This means that, after the movement correction, the magnetic resonance measurement data and/or magnetic resonance image data reconstructed from the magnetic resonance measurement data are of a quality to allow the medical diagnosis in question to be mad therefrom, so it is appropriate for the diagnostic data to be made available i.e. displayed to a user on a display unit and/or stored in a database. The image measurement includes multiple recording of at least parts of the examination region. This enables the magnetic resonance measurement data to be acquired as a time series. For example the magnetic resonance measurement data can be acquired several times from the two-dimensional or three-dimensional examination region at different instants of time. The repeated measurement of the examination region facilitates the consideration of dynamic effects within the anatomy depicted. One example of this is neuro-perfusion measurements that can be used to analyze the hemodynamics of the brain. To this end, time-resolved analysis of the injection of contrast medium into the brain of the object under examination is performed and quantitative parameters calculated therefrom. A further example, which is described in more detail below, is the use of a functional magnetic resonance technique. It is also conceivable for the examination region to be acquired only once in the image measurement in addition to the reference region. It is also possible for there to be temporally varying contrasts in the magnetic resonance measurement data. In this context, the acquisition of the magnetic resonance measurement data can be non-accelerated or performed using an acceleration method, such as, for example, the simultaneous multislice measuring-technique described in more detail below.

The examination region is also called the imaged volume or field of view (FOV). The examination region is typically defined by a user, for example from a localizer image. Alternatively or additionally, the examination region can also be defined automatically, for example on the basis of a selected protocol. According to the suggested procedure, the examination region in particular comprises a number of sub-regions, namely at least the first and the second sub-region. The examination region can also have further sub-regions, which are different from the first and second sub-regions. In particular, a single slice of the magnetic resonance sequence can represent a sub-region of the examination region. Larger sub-regions, for example composed of multiple slices located adjacently or spaced apart from one another, or smaller sub-regions of the examination region, are conceivable. The multiple sub-regions are disjunct from one another. This means that no slice of the examination region is simultaneously located in two sub-regions of the plurality of sub-regions (no overlap). The acquisition of the magnetic resonance measurement data from the number of sub-regions of the examination region is performed separately for the multiple sub-regions.

The movement of the object under examination that has taken place can be reflected in image contents of the respective magnetic resonance measurement data compared to image contents of the reference region. This enables the first item of movement information to be determined by means of a registration of the first set of magnetic resonance measurement data to the reference region, in particular an image content of the reference region. Similarly, it is also possible for the second item of movement information to be determined by the registration of the second set of magnetic resonance measurement data to the reference region, in particular an image content of the reference region. It is also possible for another method that appears reasonable to those skilled in the art, and is not based on registration to be used for the determination of the first item of movement information and the second item of movement information. In this context, the first or second item of movement information is determined by a registration in the image domain, and not in k-space. This makes it necessary to convert the first or second item of movement information determined in the image domain such that the corresponding transformations in k-space can be performed using the first or second item of movement information. The first item of movement information can be determined specifically for the first set of magnetic resonance measurement data so that it can compensate the movement of the object under examination during the acquisition of the measurement data from the first sub-region. Similarly, the second item of movement information is determined specifically for the second set of magnetic resonance measurement data so that it can compensate the movement of the object under examination during the acquisition of the measurement data from the second sub-region. Accordingly, the first or second item of movement information should be based on the contributions of the examination region and the reference region.

The determination of the first or second item of movement information can be the determination of first or second movement parameters, also known as transformation parameters. In this context, the movement parameters or transformation parameters are determined specifically for the first sub-region and the second sub-region. The movement parameters are designed such that they are able to compensate a movement when they are applied to the measurement data stored in the respective k-space data set. To enable the first or second item of movement information to be determined particularly quickly and robustly from the respective magnetic resonance measurement data and the reference region, a modeling assumption can be made for the first or second item of movement information. The modeling assumption can be the movement parameters of the first or second item of movement information. Here, a rigid modeling assumption is particularly advantageous for the first or second item of movement information. It is also possible to make other modeling assumptions that appear reasonable to those skilled in the art for the first or second item of movement information, for example non-rigid modeling assumptions.

It is now possible to use the first item of movement information and the second item of movement information to perform a retrospective movement correction of the magnetic resonance measurement data. In this context, the movement correction is initially performed separately for the first set of magnetic resonance measurement data and the second set of magnetic resonance measurement data. This separate movement correction involves a separate transformation of the first k-space data set and the second k-space data set. Subsequently, the movement correction involves the conversion of the combined first transformed k-space data set and the second transformed k-space data set into the image domain, whereby the movement-corrected magnetic resonance image data are generated.

The partial acquisition of the first sub-region of the examination region is represented in the first k-space data set, and the partial acquisition of the second sub-regions of the examination region is represented in the second k-space data set. This enables the different partial acquisitions of the examination region to be represented by their own, in particular two-dimensional or three-dimensional, k-space data sets. In this context, the first k-space data set can result from a conversion of the first set of magnetic resonance measurement data acquired from the first sub-region of the number of sub-regions into k-space data, for example by a Fourier transform of the first set of magnetic resonance measurement data. Similarly, the second k-space data set can result from a conversion of the second set of magnetic resonance measurement data acquired from the second sub-region of the number of sub-regions into k-space data, for example by a Fourier transform of the second set of magnetic resonance measurement data. Alternatively, it is also possible for the first k-space data set to be formed directly from the raw data acquired from the first sub-region. Similarly it is possible for the second k-space data set to be formed directly from the raw data acquired by the second sub-region. This alternative procedure can be particularly advantageous with two-dimensional magnetic resonance imaging with which individual slice groups or slices are excited.

The first item of movement information determined from the first set of magnetic resonance measurement data and the reference region, in the image domain, can be used for the transformation of the first k-space data. Similarly, the first item of movement information determined from the first set of magnetic resonance measurement data and the reference region, in the image domain, can be used for the transformation of the first k-space data. As will be described below, the movement parameters of the first or second item of movement information are converted from the image domain into k-space so that the transformation of the respective k-space data set can take place. For example, translation in the image domain corresponds to phase multiplication in k-space. Rotation operations in the image domain correspond to rotation operations in k-space. The transformations obtained in this way can then be applied to the measurement data stored in the respective k-space data sets. The first k-space data and the second k-space data are transformed independently of one another, with different transformation specifications resulting from the first item of movement information or the second item of movement information.

The result of the transformation of the first k-space data using the first item of movement information is a first transformed k-space data set. The result of the transformation of the second k-space data using the second item of movement information is a second transformed k-space data set. The first transformed k-space data set and the second transformed k-space data set are combined after the transformation, i.e. joined or united. In this context, the joining or uniting of the first transformed k-space data set and the second transformed k-space data set can take place by a mathematic operation.

The combination of the first transformed k-space data set and the second transformed k-space data set can then be converted into the image domain in order to generate the movement-corrected magnetic resonance image data. The combination of the first transformed k-space data set and the second transformed k-space data set can be converted into the image domain using an inverse Fourier transform, such as an inverse non-uniform Fourier transform.

To summarize, the movement correction of the magnetic resonance image data is carried out separately for different sub-regions of the examination region. The movement correction itself is performed separately for the different k-space data sets assigned to the magnetic resonance measurement data recorded from the respective sub-regions. Subsequently, the different k-space data sets can be combined and inversely transformed into the image domain. The inventive method does not require the adaptation of the magnetic resonance sequence that is used to carry out the image measurement.

In this context, the movement correction in the respective k-space data sets and the combined inverse transformation of the plurality of k-space data sets provides the advantage that, during the conversion into the image domain, interpolation of the movement-corrected magnetic resonance image data onto desired target coordinates, in particular onto a uniform Cartesian grid, is performed implicitly. If the movement correction is carried out separately for the number of sub-regions of the examination region in the spatial domain, an interpolation error would occur in many cases. In this context, the interpolation error would be location-dependent (spatially dependent), since the available image information is typically not distributed uniformly in the image domain. Hence, pure movement correction in the image domain can result in corruption of the image information due to artifacts. The inventive procedure offers the advantage that the implicit interpolation during the conversion of the combination of the first transformed k-space data set and the second transformed k-space data set into the image domain can be performed without errors even in the case of non-uniform sampling of the image information, as often occurs in cases when there has been a movement of the object under examination.

Furthermore, the inventive procedure offers the advantage that the movement information can be determined separately for the different sub-regions of the examination region. Hence, the movement information can be determined using parts of the examination region that were measured at nearby times and/or simultaneously and can contain mutually consistent image information. This enables a separate movement correction to be performed for the different sub-regions of the examination region using the respective pieces of movement information determined. This enables a modeling assumption, for example of a rigid movement, for the movement correction of the sub-regions of the examination region to be satisfied more effectively than for the movement correction of the entire examination region.

The inventive procedure also offers the advantage that movements of the object under examination that take place during the acquisition of the examination region can be compensated. Hence, during the suggested movement correction, it is not necessary to assume that there is no movement of the object under examination during the acquisition of the examination region. This assumption that the acquisition of the entire examination region is not corrupted by movement is unrealistic and can represent a significant impediment during the detection of the movement and/or the interpolation of the movement-corrected measurement data. The modeling assumption of movement-free acquisition of the entire examination region is removed with the suggested procedure. The inventive procedure can compensate an actually existing movement of the object under examination that occurs during the acquisition of the magnetic resonance measurement data from the examination region.

The separate movement correction for the sub-regions of the examination region enables the compensation of the movement of the object under examination on a shorter time scale. Thus, it is possible for an updating cycle of the movement information to be shortened and hence a movement of the object under examination to be modeled on shorter time scales. This enables a continuous movement of the object under examination to be modeled in sections, for example by individual rigid transformations. Simultaneously, a movement of the object under examination during the acquisition of the sub-regions of the examination region can be smaller than a movement of the object under examination during the acquisition of the entire examination region. This enables a compromise over an entire acquired examination region to be avoided during the determination of the movement information. This enables an error during the determination of the movement information and hence image artifacts in the movement-corrected magnetic resonance image data to be minimized. Taking a reduced number of slices into consideration can also reduce the calculation volume during the determination of the movement information.

The examination region can comprise any number of sub-regions, in particular greater than two. The procedure according to the invention, which was initially described for two sub-regions only, can be extended analogously to the further sub-regions. Embodiments of the procedure according to the invention can be applied analogously to any number of sub-regions. For example, the examination region can include a third sub-region in addition to the first sub-region and the second sub-region to which the procedure is then analogously extended. In this case, then a third item of movement information from the reference region and a third set of magnetic resonance measurement data, which was acquired from the third sub-region, is determined, wherein a third k-space data set, which represents the third set of magnetic resonance measurement data, is transformed using the third item of movement information. A combination of the first transformed k-space data set, the second transformed k-space data set and the third transformed k-space data set is converted into the image domain, whereby the movement-corrected magnetic resonance image data are generated. It is generally possible for, in each case, an item of movement information from the reference region and the respective magnetic resonance measurement data acquired from the number of sub-regions to be determined separately for each of the number of sub-regions. A number of separate k-space data sets representing the magnetic resonance measurement data acquired from the number of sub-regions is transformed using the associated movement information in each case. A combination of the number of transformed k-space data sets is converted into the image domain, whereby the movement-corrected magnetic resonance image data are generated. The conversion of the magnetic resonance measurement data belonging to the individual partial acquisitions in the respective k-space data sets and the transformation of the respective k-space data sets can then be repeated for each sub-region of the examination region until all corrected k-space data sets of the entire examination region are available.

In an embodiment, the conversion of the combination of the first transformed k-space data set and the second transformed k-space data set into the image domain involves the use of an inverse non-uniform Fourier transform. The inverse non-uniform Fourier transform is also known as "NUFT". The non-uniform Fourier transform is used with input data arrayed on a non-uniformly sampled grid. The first transformed k-space data set and the second transformed k-space data set, namely a combination of the first transformed k-space data set and the second transformed k-space data set, represent the input parameters of the inverse non-uniform Fourier transform. In this context, the first transformed k-space data set and/or the second transformed k-space data set can be sampled non-uniformly, such as when a rotation of the respective k-space data is performed as a transformation. The inverse non-uniform Fourier transform can transform the first transformed k-space data set and the second transformed k-space data set to form a single image domain data set and hence generate the movement-corrected magnetic resonance measurement data. Furthermore, the inverse non-uniform Fourier transform can simultaneously perform an advantageous interpolation of the movement-corrected magnetic resonance measurement data. Thus, the inverse non-uniform Fourier transform is particularly suitable for the inverse transformation of the movement-corrected measurement data in k-space to the image domain.

In another embodiment, the determination of the first item of movement information from the reference region and the first set of magnetic resonance measurement data involves the determination of first rigid transformation parameters, which are used to transform the first k-space data, and the determination of the second item of movement information from the reference region and the second set of magnetic resonance measurement data involves the determination of second rigid transformation parameters, which are used to transform the second k-space data. The rigid transformation parameters are six movement parameters, namely three translation parameters and three rotation parameters. If they are determined in the image domain, the rigid transformation parameters can be further adapted for the performance of the respective transformations in k-space, thus enabling the corresponding transformations of the k-space data.

The use of a rigid modeling assumption has been found to be beneficial in the case of magnetic resonance imaging of a head of the object under examination. This is due to the fact that an intended movement of the brain by the surrounding skull can only be rigid. Non-rigid components, for example due to the pulsation of the liquor and the blood, are comparatively small.

In another embodiment, the first k-space data are generated by a Fourier transform of the first set of magnetic resonance measurement data, and the second k-space data are generated by a Fourier transform of the second set of magnetic resonance measurement data. Therefore, in this case, the first set of magnetic resonance measurement data and the second set of magnetic resonance measurement data initially are in the image domain and are transformed for the movement correction into the first k-space data and the second k-space data. The transformation of the first set of magnetic resonance measurement data into the first k-space data and the second set of magnetic resonance measurement data into the second k-space data can take place separately from each other, i.e. with separately performed Fourier transforms.

In another embodiment, the first item of movement information describes a first movement of the object under examination between the first point in time and the acquisition of the first set of magnetic resonance measurement data, and the first k-space data are transformed using the first item of movement information such that the first movement of the object under examination in the first k-space data set is compensated. Also in this embodiment, the second item of movement information describes a second movement of the object under examination between the first point in time and the acquisition of the second set of magnetic resonance measurement data, and the second k-space data are transformed using the second item of movement information such that the second movement of the object under examination in the second k-space data set is compensated. The first movement of the object under examination can in this context may take place between the first point in time and the acquisition of the first set of magnetic resonance measurement data. Similarly, the second movement of the object under examination may take place between the first point in time and the acquisition of the second set of magnetic resonance measurement data. For example, this can be a respiratory movement and/or a cardiac movement of the object under examination. There can also be arbitrary movements of limbs of the object under examination. The movement of the object under examination that has taken place can be reflected in image contents of the respective magnetic resonance measurement data compared to the image contents of the reference region. The movement of the object under examination can then be compensated as well as possible for the respective sub-region in the respective k-space data sets.

In another embodiment, the first k-space data set and the second k-space data set represent mutually independent autonomous k-space data sets. This means that the first k-space data set is generated on the basis of different magnetic resonance measurement data from the second k-space data set. Thus each partial acquisition of a sub-region of the examination region can be represented by its own k-space data set. Hence, the first k-space data set and the second k-space data set represent magnetic resonance measurement data recorded from different sub-regions of the examination region. This also enables transformations of the first k-space data set and the second k-space data set to be performed independently of one another. Thus, a particularly advantageous movement correction can be performed for the respective sub-regions.

In a further embodiment, the first sub-region represents a first set of first slices of the examination region and the second sub-region represents a second set of second slices of the examination region. Consequently, the examination region is composed of a set of multiple slices, wherein a first set of first slices represents a first sub-set of the set of multiple slices and a second set of second slices represents a second sub-set of the set of multiple slices. The first set of first slices is disjunct from the second set of the second slices.

In another embodiment, the first slices and the second slices are spatially interleaved with respect to each other. Thus a spatial coverage of the first sub-regions and the second sub-regions can overlap, although the first sub-region and the second sub-region are respectively formed by slices that are disjunct from one another. Therefore, respective second slices of the second set are positioned spatially between the respective first slices of the first set. Thus, the first slices and the second slices are acquired an interleaved acquisition. Therefore, spatially adjacent slices are acquired with a time interval with respect to one another. Thus a movement of the object under examination during this time interval can cause spatially adjacent slices to contain contradictory anatomical information. With a conventional method for movement correction, this can lead to problems with the determination of the movement parameters and/or the interpolation of the movement-corrected image volume. The inventive procedure is used to take into account the mutually consistent first slices acquired with respect to the movement correction separately from the similarly mutually consistent second slices acquired. Hence, the inventive procedure can enable a particularly robust movement correction for different sub-regions of the examination region, which are interleaved with each other.

In another embodiment, the first slices represent a first slice group that is coherently excited by a simultaneous multislice measuring-technique and the second slices represent a second slice group that is coherently excited by the simultaneous multislice measuring-technique. The simultaneous multislice measuring technique is also known as the simultaneous multislice (SMS) technique, and enables the accelerated acquisition of the magnetic resonance measurement data. The simultaneous multislice measuring-technique is described, for example, in the publication Setsompop et al. "Blipped-controlled aliasing in parallel imaging for simultaneous multislice echo planar imaging with reduced g-factor penalty.", Magn Reson Med. 2012. 67(5): 1210-1224. The simultaneous multislice measuring-technique, as noted, implements simultaneous coherent excitation of multiple slices of the examination region, in this case the first coherently excited slice group and the second coherently excited slice group. In this context, the slices in a coherently excited slice group are excited simultaneously by a radio-frequency pulse that acts simultaneously on all slices in the coherently excited slice group. Subsequently, the magnetic resonance signals from each of the multiple slices of the respective coherently excited slice group are read out simultaneously and superimposed in k-space. The subsequent reconstruction of the individual slices then involves the separation of the simultaneously read-out magnetic resonance signals with respect to the individual slices. Thus, the first slices in the first coherently excited slice group are excited by a single excitation pulse and read out in one single read-out process. The same applies to the second slices of the second coherently excited slice group. Preferably, interleaved acquisition of the multiple slices is performed in order to minimize the influence on spatially adjacent slices from temporally successive slice measurements (possible cross-talks). The simultaneous acquisition of the multiple slices can greatly reduce the time required for the acquisition of the magnetic resonance measurement data. Furthermore, the suggested movement correction can exploit a consistency of the coherently excited slices in the first or second coherently excited slice group. The first or second coherently excited slice group is acquired in a single movement status of the object under examination.

In another embodiment, a first set of movement-corrected magnetic resonance image data is generated and made available using the combination of the first transformed k-space data set and the second transformed k-space data set converted into the image domain and a second set of movement-corrected magnetic resonance image data is generated and made available using the combination of the first transformed k-space data set, the second transformed k-space data set, and the third transformed k-space data set converted into the image domain. The provision of the second movement-corrected magnetic resonance image data takes place at a time after the provision of the first movement-corrected magnetic resonance image data. Thus, the conversion of the transformed k-space data sets is not mandatorily performed on a grid of the entire examination region. Instead, it is possible to perform an inverse transformation of a sub-set of the multiple k-space data sets assigned to the multiple sub-regions of the examination region. In this context, the conversion into the image domain can also be performed step-by-step for each measurement of the sub-region, in particular in the manner of a sliding-window method. Thus, it is possible artificially to increase the time resolution of the movement-corrected magnetic resonance image data. A maximum achievable time resolution of this kind lies in the time duration required that is required for the acquisition of a sub-region of the examination region.

In another embodiment, the conversion of the combination of the first transformed k-space data set, the second transformed k-space data set and the third transformed k-space data set into the image domain excludes consideration of at least one k-space data set from the set of the first transformed k-space data set, the second transformed k-space data set and the third transformed k-space data set. The inverse non-uniform Fourier transform described above can be performed on the basis of any sub-set of these three transformed k-space data sets. The at least one k-space that is excluded from the set of these three transformed k-space data sets has such properties that would cause the consideration of the at least one excluded k-space data set during the image reconstruction, to have a negative impact on the image quality of the movement-corrected magnetic resonance image data. For example, the at least one excluded k-space data set may have a determined item of movement information that deviates greatly from the movement information determined for other k-space data sets among the first transformed k-space data set, the second transformed k-space data set and third transformed k-space data set. Thus, the exclusion of the at least one k-space data set during the reconstruction of the movement-corrected magnetic resonance image data can further improve the robustness of the movement correction.

In another embodiment, a magnetic resonance sequence with first sequence parameters is used for the reference measurement and a magnetic resonance sequence with second sequence parameters is used for the image measurement. The magnetic resonance sequence with the first sequence parameters is less sensitive to movement of the object under examination than the magnetic resonance sequence with the second sequence parameters. Another type of magnetic resonance sequence and/or difference first sequence parameters can be used for the reference measurement than for the image measurement. In this context, it is advantageous to use a type of magnetic resonance sequence and/or first sequence parameters for the reference measurement that ensure that the reference region acquired is free of movement artifacts and/or less susceptible to movements of the object under examination. This procedure is based on the consideration that corruption of the reference measurements due to movements of the object under examination can usually influence the movement correction of the entire set of magnetic resonance measurement data.

In another embodiment, the examination region is a brain region of the object under examination and the image measurement is performed using a functional magnetic resonance technique. With the functional magnetic resonance technique, typically the BOLD effect is used to analyze the change to oxygenated blood compared to deoxygenated blood over time. For the functional magnetic resonance technique, usually a time series of examination volumes is recorded and, as described above, the change in intensity over time caused by the degree of oxygenation of the blood is analyzed in the images of the time series. With functional imaging of the brain, it can be advantageous to compensate movements of the object under examination on a shorter time scale than that for the acquisition of the entire examination region. The acquisition of the entire examination region, for example the entire head region and/or brain region, can take several seconds, for example three seconds. This time period can encompass a complete respiratory movement of the object under examination. This time period can also encompass several cardiac cycles, causing the pulsation of cerebrospinal fluid in the brain. In addition, the object under examination can execute an unintentional movement of the head or eyes during this time period. The inventive procedure offers the advantage that it is possible to compensate all these movements, which take place on this time scale. The described method for movement correction also can be applied to regular anatomical magnetic resonance techniques and/or other body regions of the object under examination.

In another embodiment, intensity fluctuations and/or an intensity shift are compensated during the generation of the movement-corrected magnetic resonance image data. This correction can advantageously take place during the inventive procedure, i.e. during one sub-step of the multiple sub-steps described.

The magnetic resonance apparatus according to the invention has a scanner operable to implement a reference measurement and an image measurement and a computer with a first determining processor, a second determining processor, a first transformation processor, a second transformation processor, a conversion processor and an output interface. These components of the magnetic resonance device are collectively designed to implement a method according to the invention as described above.

Thus, the magnetic resonance apparatus is designed to carry out the method for movement correction of magnetic resonance measurement data acquired during magnetic resonance imaging of an object under examination. The scanner is operated to carry out a reference measurement at a first point in time during the magnetic resonance imaging, wherein a reference region is acquired. The scanner is operated to carry out an image measurement at a time after the first point in time during the magnetic resonance imaging, wherein magnetic resonance measurement data are acquired from a number of sub-regions of an examination region. The first determining processor is configured for the determination of a first item of movement information from the reference region and a first set of magnetic resonance measurement data, which is acquired from a first sub-region of the number of sub-regions. The second determining processor is configured for the determination of a second item of movement information from the reference region and a second set of magnetic resonance measurement data, which are acquired from a second set sub-region of the number of sub-regions. The first transformation processor is configured for the transformation of a first k-space data set representing the first set of magnetic resonance measurement data using the first item of movement information. The second transformation processor is configured for the transformation of a second k-space data set representing the second set of magnetic resonance measurement data using the second item of movement information. The conversion processor is configured to convert a combination of the first transformed k-space data set and the second transformed k-space data set into the image domain, whereby movement-corrected magnetic resonance image data are generated. The output interface is configured for the provision of the movement-corrected magnetic resonance image data as an electronic output such as a data file for display or storage.

The components of the computer of the magnetic resonance apparatus according to the invention, namely the first determining processor, second determining processor, first transformation processor, second transformation processor, conversion processor and output interface can be predominantly embodied in the form of software components. These components, in particular when fast calculations are required, also can be partially implemented in the form of software-supported hardware components, for example FPGAs or the like. Similarly, when only the transfer of data from other software components is involved, the required interfaces can, for example, be embodied as software interfaces. However, they can also be embodied as hardware interfaces, which are controlled by suitable software. It is also conceivable for a number of these components to be implemented in the form of a single software component or a single software-supported hardware component.

The present invention also encompasses as a non-transitory, computer-readable data storage medium encoded with program code that, when executed in a computer of a magnetic resonance apparatus causes the computer to itself operate, and to operate the magnetic resonance apparatus, in order to perform the method according to the invention as described above.

Examples of electronically readable data media are DVDs, magnetic tapes or USB sticks on which electronically readable control information, in particular software, is stored.

The advantages of the magnetic resonance apparatus and the storage medium according to the invention correspond to the advantages of the method according to the invention that were explained above in detail. All features, advantages or alternative embodiments can also be transferred to the other aspects of the invention. The functional features of the method are embodied by corresponding substantive modules, in particular hardware modules.

BRIEF DESCRIPTION OF THE DRAWINGS

FIG. 5, composed of FIGS. 5A and 5B, is an exemplary illustration of the procedure described in FIG. 4 according to the third embodiment of the method according to the invention.

DESCRIPTION OF THE PREFERRED EMBODIMENTS

Figure 1:
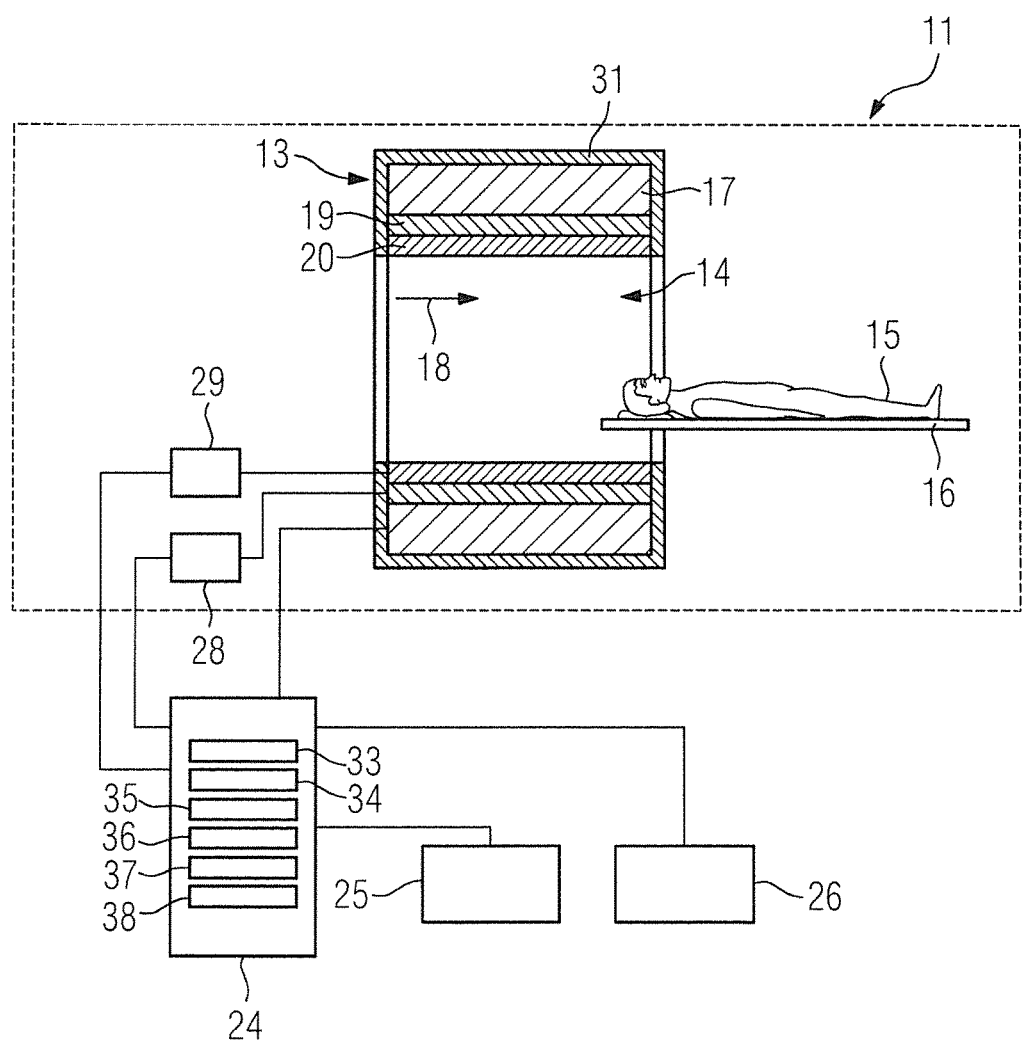
FIG. 1 is a schematic illustration of a magnetic resonance apparatus according to the invention.

FIG. 1 is a schematic illustration of a magnetic resonance apparatus 11 according to the invention. The magnetic resonance apparatus 11 has a data acquisition scanner 13 with a basic field magnet 17 for the generation of a strong and constant particular basic magnetic field 18. The scanner 13 has a cylindrical patient reception area 14 for receiving an object under examination 15, in the present case a patient. The patient reception area 14 is cylindrically enclosed in a circumferential direction by the scanner 13 so as to have a cylindrical shape. The patient 15 can be moved into the patient reception area 14 by a patient support 16. The patient support 16 has a table that is moveable within the scanner 13. The scanner 13 is screened from the outside by a cladding 31 of the housing of the scanner 13.

The scanner 13 also has a gradient coil arrangement 19 for generating magnetic field gradients, which are used for spatial encoding during imaging. The gradient coil arrangement 19 is operated by a gradient controller 28. The scanner 13 also has a radio-frequency antenna 20, which, in the case shown, is designed as a body coil permanently integrated in the scanner 13. A radio-frequency controller 29 operates the radio-frequency antenna 20 so as to radiate radio-frequency magnetic resonance sequences into an examination chamber, which is substantially formed by the patient reception area 14. The radiated radio-frequency sequences excite certain nuclear spins in the patient 15, so as to give the excited nuclear spins a magnetization that deviates from the polarization established by the basic magnetic field 18. As the excited nuclear spins relax, they emit magnetic resonance signals, which are also radio-frequency signals. The radio-frequency antenna 20, or another antenna, is further designed to receive the magnetic resonance signals from the patient 15.

To operate the basic field magnet 17, the gradient controller 28 and the radio-frequency controller 29, the magnetic resonance apparatus 11 has a computer 24. The computer 24 is used for central control of the magnetic resonance apparatus 11, such as the performance of a predetermined gradient echo sequence. Control information such as imaging parameters and reconstructed magnetic resonance images can be made available to a user on an output interface 25, in the present case a monitor, of the magnetic resonance apparatus 11. The magnetic resonance apparatus 11 also has an input interface 26 via which information and/or parameters can be entered by a user during a measuring process. The computer 24 can include the gradient controller 28 and/or radio-frequency controller 29 and/or the output interface 25 and/or the input interface 26.

In the case shown, the computer 24 comprises a first determination processor 33, a second determination processor 34, a first transformation processor 35, a second first transformation processor 36, a conversion processor 37 and an output processor 38. In the present case, the scanner 13 is operated as a reference measurement unit 32 and an image measurement unit to carry out the method according to the invention for movement correction of magnetic resonance measurement data.

The magnetic resonance apparatus 11 shown can have further components typically included in a magnetic resonance apparatus. The general mode of operation of a magnetic resonance apparatus is known to those skilled in the art so that a more detailed description is not necessary herein.

Figure 2:
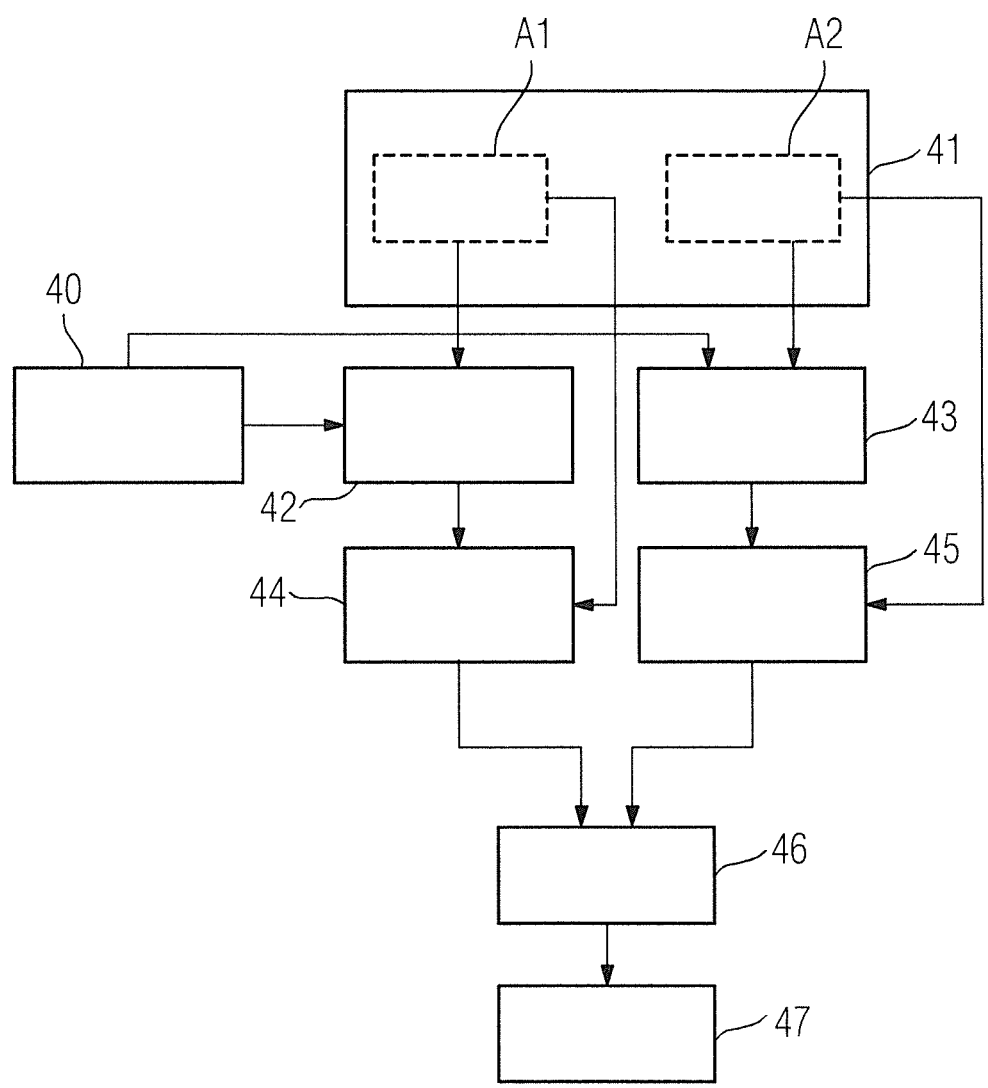
FIG. 2 is a flowchart of a first embodiment of the method according to the invention.

FIG. 2 is a flowchart of a first embodiment of the method according to the invention for movement correction of magnetic resonance measurement data acquired during magnetic resonance imaging of an object under examination 15 by operation of the magnetic resonance apparatus 11.

In a first method step 40, a reference measurement is performed at a first point in time during the magnetic resonance imaging by operation of the scanner 13, wherein a reference region is acquired.

In a further method step 41, the performance of an image measurement takes place at a time after the first point in time during the magnetic resonance imaging by operation of the scanner 13, wherein magnetic resonance measurement data are acquired from a number of sub-regions of an examination region. During the image measurement, in a first step A1, a first set of magnetic resonance measurement data is acquired from a first sub-region of the number of sub-regions. During the image measurement, in a second step A2, a second set of magnetic resonance measurement data is acquired from a second set sub-region of the number of sub-regions.

In a further method step 42, a first item of movement information is determined from the reference region and the first set of magnetic resonance measurement data, which is acquired from the first sub-region of the number of sub-regions, by the first determining processor 33.

In a further method step 43, a second item of movement information is determined from the reference region and the second set of magnetic resonance measurement data, which is acquired from the second sub-region of the number of sub-regions, by the second determining processor 34.

In a further method step 44, a first k-space data set representing the first set of magnetic resonance measurement data is transformed using the first item of movement information by the first transformation processor 35.

In a further method step 45, a second k-space data set representing the second set of magnetic resonance measurement data is transformed using the second item of movement information by the second transformation processor 36.

In a further method step 46, a combination of the first transformed k-space data set and the second transformed k-space data set is converted into the image domain, whereby movement-corrected magnetic resonance image data are generated by the transformation processor 37.

In a further method step 47, the movement-corrected magnetic resonance image data are made available by the output processor 38. In this context, the output can be, for example, the display of the movement-corrected magnetic resonance image data on the display monitor of the output interface 25. The output processor 38 also can store the movement-corrected magnetic resonance image data in a database.

Figure 3:
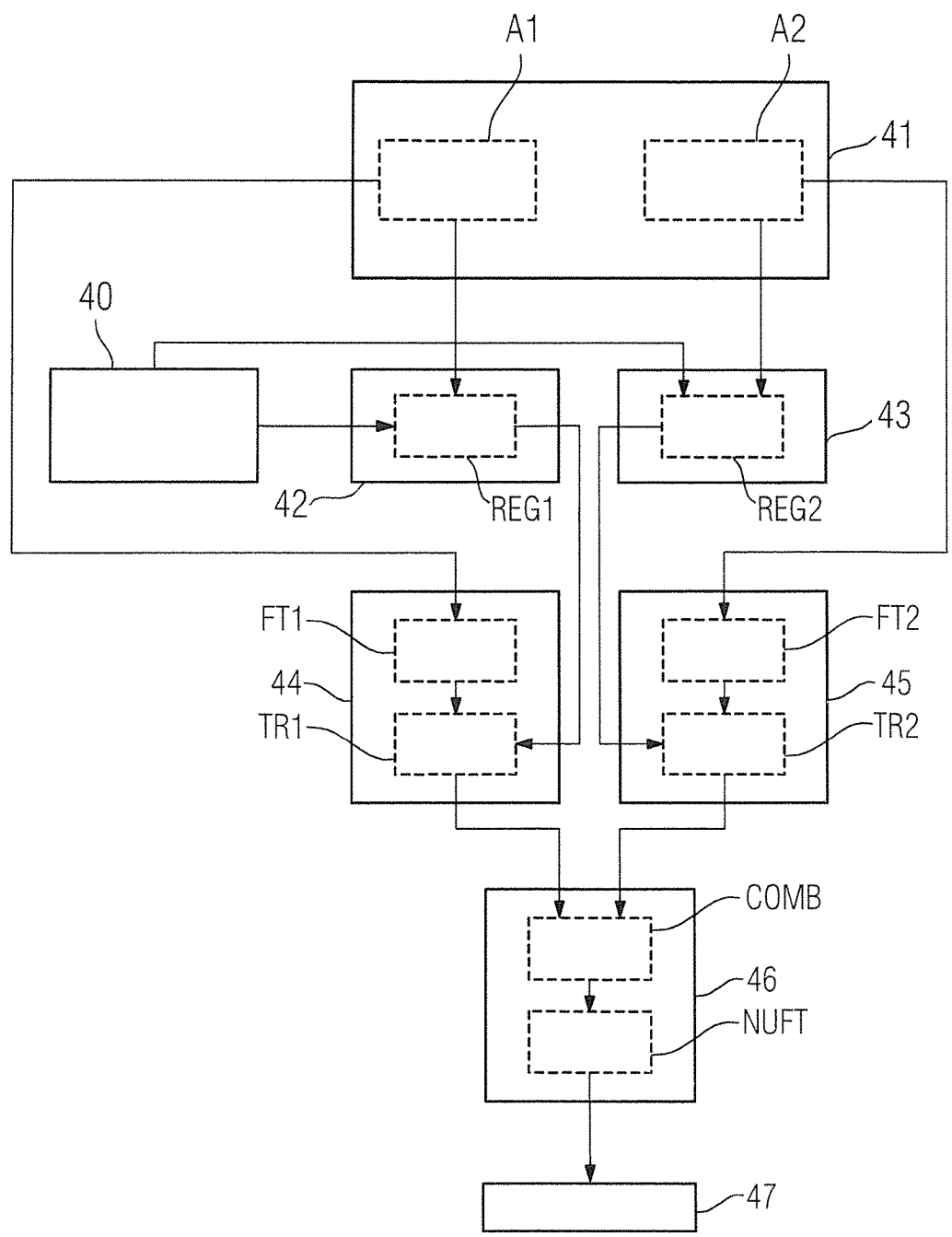
FIG. 3 is a flowchart of a second embodiment of the method according to the invention.

FIG. 3 shows a flowchart of a second embodiment of the method according to the invention for movement correction of magnetic resonance measurement data acquired during magnetic resonance imaging of an object under examination 15 by operation of the magnetic resonance apparatus 11.

The following description is substantially restricted to the differences from the exemplary embodiment in FIG. 2, wherein reference is made to the description of the exemplary embodiment in FIG. 2 with respect to the same method steps. Method steps that are substantially the same are in principle given the same reference characters.

The embodiment of the method according to the invention shown in FIG. 3 includes the method steps 40, 41, 42, 43, 44, 45, 46, 47 of the first embodiment of the method according to the invention according to FIG. 2. The embodiment of the method according to the invention shown in FIG. 3 has additional method steps and sub-steps. Also conceivable is an alternative method sequence to that shown in FIG. 3, which includes only a part of the additional method steps and/or sub-steps shown in FIG. 3. Such an alternative method sequence for FIG. 3 can also include additional method steps and/or sub-steps.

For the reference measurement in the further method step 40, a magnetic resonance sequence with first sequence parameters, while a magnetic resonance sequence with second sequence parameters is used for the image measurement in the further method step 41. The magnetic resonance sequence with the first sequence parameters is less sensitive to movement of the object under examination 15 than the magnetic resonance sequence with the second sequence parameters.

In the case shown in FIG. 3, the determination of the first item of movement information from the reference region and the first set of magnetic resonance measurement data is the determination of first rigid transformation parameters in a sub-step REG1 of the further method step 42. To this end, for example, the first set of magnetic resonance measurement data can be registered to the reference region. In this context, the first item of movement information can describe a first movement of the object under examination 15 between the first point in time and the acquisition of the first set of magnetic resonance measurement data. Similarly, the determination of the second item of movement information from the reference region and the second set of magnetic resonance measurement data is the determination of second rigid transformation parameters in a sub-step REG2 of the further method step 42. To this end, for example, the second set of magnetic resonance measurement data can be registered to the reference region. In this context, the second movement information can describe a second movement of the object under examination 15 between the first point in time and the acquisition of the second set of magnetic resonance measurement data. The rigid movement parameters typically are three translation parameters in the form of a translation vector b and three rotation parameters in the form of a rotation matrix A. in the case shown, the rigid movement parameters are determined in the spatial domain.

In the case shown, the further method step 44 includes a first sub-step FT1, in which the first k-space data set is generated by a Fourier transformation of the first set of magnetic resonance measurement data. Similarly, the further method step 45 is a second sub-step FT2, in which the second k-space is generated by a Fourier transformation of the second set of magnetic resonance measurement data. Thus, the first k-space data set and the second k-space data set represent mutually independent autonomous k-space data sets. Subsequently, in a second sub-step TR1 of the further method step 44, the first k-space data set is transformed using the first item of movement information such that the first movement of the object under examination 15 in the first k-space data set is compensated. Similarly, in a second sub-step TR2 of the further method step 45, the second k-space data set is transformed using the second item of movement information such that the second movement of the object under examination 15 in the second k-space data set is compensated.

For the transformation of the first or second k-space data set, the first or second item of movement information, which was determined according to FIG. 3 in the spatial domain, is converted into k-space data set. In the case of a rigid transformation, the following procedure can be used for this when $F(\xi)$ is the Fourier transform of the partial acquisition $f(x)$ of the first or second sub-regions:

A translation b of partial acquisition in the image domain corresponds to a phase multiplication of the associated frequency space or k-space:

$$f(x\pm b)=\exp(\pm 2\pi ib\xi)F(\xi)$$

A rotation of the partial acquisition in the image domain about the rotation matrix A corresponds to the identical rotation in the associated frequency space or k-space:

$$F(f(Ax))=Ff(A\xi)$$

Both transformations (translation and rotation) can also be depicted in the associated frequency space or k-space as follows:

$$F(f(Ax+b)) = \exp(2\pi ib \cdot A^{-T}\xi)\frac{1}{|\det A|}Ff(A^{-T}\xi).$$

In this context, the translation only results in simple phase multiplication in k-space and does not change any position of the measurement data in k-space. The rotation operation results in a rotation of the measurement data in k-space. Thus, measurement data in k-space can be displaced by the rotation at points in k-space, which lie between grid points of k-space. In this way, the rotation of k-space can make the inverse transformation of k-space by a fast Fourier transform impossible.

The use of an inverse non-uniform Fourier transformation, however, can facilitate the conversion of the combination of the first transformed k-space data set and the second transformed k-space data set into the image domain. In this context, the inverse non-uniform Fourier transform implicitly enables the necessary interpolation of the image data onto the uniform grid. To this end, in a first sub-step COMB of the further method step 46, the first transformed k-space data set and the second transformed k-space data set are combined. In a second sub-step NUFT, the inverse non-uniform Fourier transform of the combination of the first transformed k-space data set and the second transformed k-space data set is then performed for the generation of the movement-corrected magnetic resonance image data, which can be made available in the further method step 47. It is possible for intensity fluctuations and/or an intensity shift to be compensated during the generation of the movement-corrected magnetic resonance image data.

Figure 4:
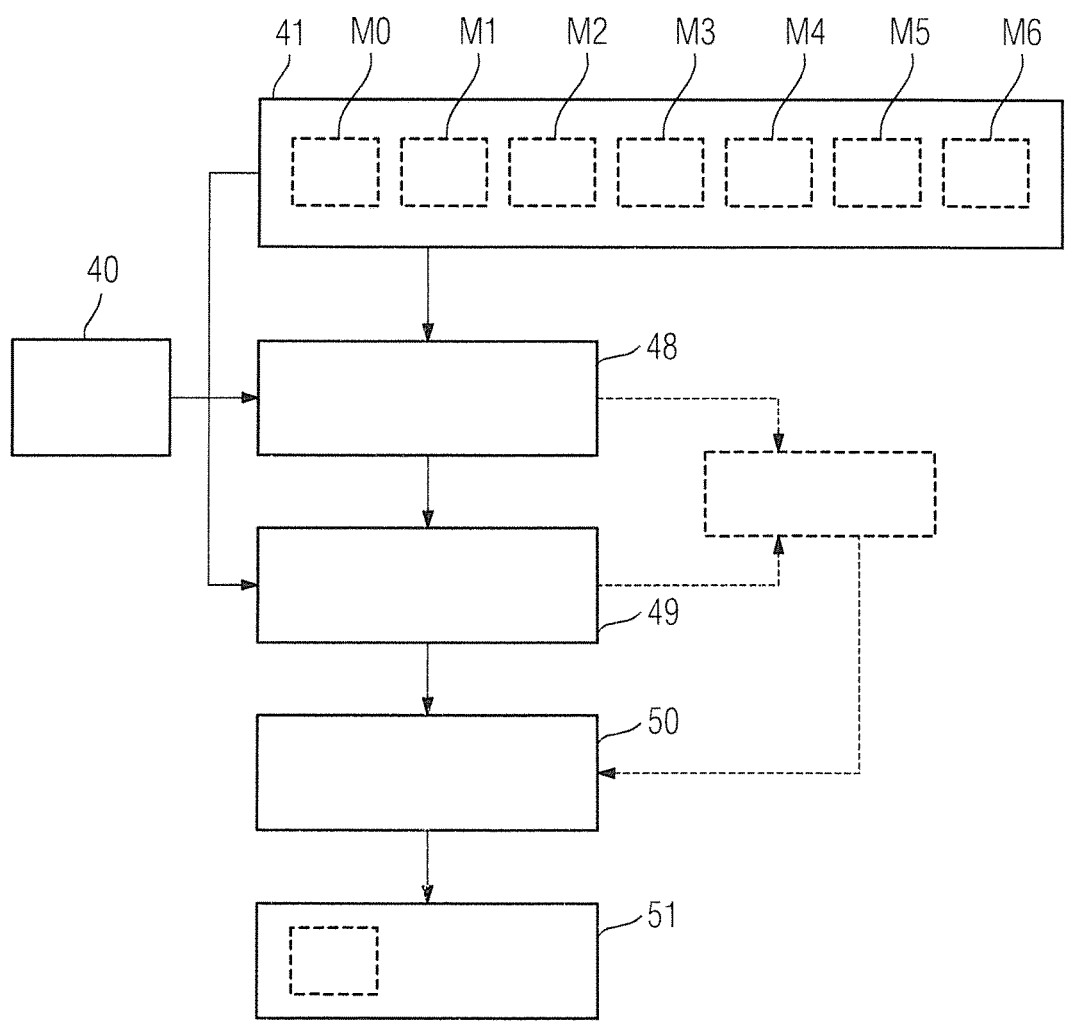
FIG. 4 is a flowchart of a third embodiment of the method according to the invention.

FIG. 4 is a flowchart of a third embodiment of a method according to the invention for movement correction of magnetic resonance measurement data acquired during magnetic resonance imaging of an object under examination 15 by means of a magnetic resonance apparatus 11. FIGS. 5, 5A and 5B shows an exemplary illustration of the procedure shown in FIG. 4 according to the third embodiment of the method according to the invention.

The following description is substantially restricted to the differences from the exemplary embodiment in FIG. 2, wherein reference is made to the description of the exemplary embodiment in FIG. 2 with respect to the same method steps. Method steps that are substantially the same are in principle given the same reference characters.

The embodiment of the method according to the invention shown in FIG. 4 includes the method steps 40, 41, 42, 43, 44, 45, 46, 47 of the first embodiment of the method according to the invention according to FIG. 2. In addition, the embodiment of the method according to the invention shown in FIG. 4 has additional method steps and sub-steps. Also conceivable is an alternative method sequence to that shown in FIG. 4, which only has a part of the additional method steps and/or sub-steps shown in FIG. 4. An alternative method sequence for FIG. 4 also can have additional method steps and/or sub-steps.

In the case shown in FIG. 4 or FIG. 5 (composed of FIGS. 5A and 5B), the examination region comprises by way of example 21 slices S0, S1, . . . , S20. Furthermore, the examination region composed, as an example, of seven sub-regions, from which in each case the magnetic resonance measurement data are acquired in seven partial acquisitions M0, M1, M2, M3, M4, M5, M6 of the further method step 41. In each of the seven partial acquisitions M0, M1, M2, M3, M4, M5, M6, three slices of 21 slices S0, S1, . . . , S20 are to be acquired, as an example. Therefore, in the case shown in FIG. 4 and FIG. 5, the examination region comprises more than two sub-regions. Therefore, in addition to the first sub-region and the second sub-region, the examination region includes a third sub-region, a fourth sub-region, etc. Furthermore, FIG. 5 depicts a case in which the examination region is or includes a brain region of the object under examination. In this way, the image measurement can be performed using a functional magnetic resonance technique. The procedure depicted in FIG. 5 should be seen as only an example.

In the case shown in FIG. 5, initially, all slices of the examination region are acquired from the reference region in the further method step 40. Therefore, the reference region corresponds to the entire examination region. Subsequently, the seven partial acquisitions M0, M1, M2, M3, M4, M5, M6, which together sample the entire examination region, are displayed. In this context, the first sub-region, which is acquired in the first partial acquisition M0, has a first set of first slices S0, S7, S14 of the examination region. In this context, the second sub-region, which is acquired in the second partial acquisition M1, has a second set of second slices S2, S9, S16 of the examination region, etc. For clarity, the partial acquisitions M2, M3, M4, M5, M6 are shown combined in FIG. 5, even though they are acquired in temporal succession. It can be identified in FIG. 5 that the respective slices of the sub-regions, for example the first slices S0, S7, S14 and the second slices S2, S9, 16, are spatially interleaved with respect to one another. Furthermore, the respective slices belonging to a partial acquisition M0, M1, M2, M3, M4, M5, M6 can in each case depict a slice group that is coherently excited slice group by a simultaneous multislice measuring-technique. For example, the first slices S0, S7, S14 can depict a first slice group that is coherently excited by means of a simultaneous multislice measuring-technique and the second slices S2, S9, 16 slices can depict a second slice group that is coherently excited by means of the simultaneous multislice measuring-technique, etc.

In the case shown in FIG. 5, in the second partial acquisition M1, namely the head of the object under examination 15, is tilted with respect to the other partial acquisitions M0, M2, M3, M4, M5, M6. This movement is intended only for purposes of illustration and is depicted in greatly simplified form for clarity. There should be no movement of the object under examination 15 during the other partial acquisitions M0, M2, M3, M4, M5, M6. The suggested procedure should compensate this head movement of the object under examination 15 in the magnetic resonance measurement data.

To this end, in a further method step 48, in each case an item of movement information is determined separately for each of the multiple sub-regions from the reference region and the respective magnetic resonance measurement data acquired from the multiple sub-regions. For example, in this case, a third item of movement information from the reference region and a third set of magnetic resonance measurement data, which is acquired in the third partial acquisition M2 from the third sub-region, is determined, etc. In a further method step 49, a number of separate k-space data sets representing the magnetic resonance measurement data acquired from the number of sub-regions is transformed using the associated movement information in each case. For example, here, a third k-space data set representing a third set of magnetic resonance measurement data is transformed using the third item of movement information. In the case shown in FIG. 5, the further method steps 48, 49 are repeated seven times in order in each case to correct the k-space data sets belonging to the partial acquisition M0, M1, M2, M3, M4, M5, M6 separately from one another with respect to the movement of the object under examination 15. Following the seven repetitions, at the end of the further method step 49, there are seven k-space data sets that are separate from one another, and that are three-dimensional, to which the respectively associated transformations were applied for the compensation of the movement of the object under examination.

As can be seen from FIG. 5, simply uniting the number of movement-corrected sub-regions of the examination region after the movement correction in the further method step 49 would result in non-uniform sampling in the image domain. For example, the anatomy depicted in the movement-corrected slices S2, S9, S16 of the second acquisition M1 deviates greatly from the anatomy measured in the other acquisitions M0, M2, M3, M4, M5, M6. Therefore, suitable interpolation is required during the inverse transformation of the number of transformed k-space data sets to the image domain. For example, in a further method step 50, a combination of the number of transformed k-space data set, for example the first transformed k-space data set, the second transformed k-space data set and the third transformed k-space data set, is converted into the image domain, whereby the movement-corrected magnetic resonance image data are generated, which can be made available in a further method step 51. In this context, the use of an inverse non-uniform Fourier transform can automatically provide the desired interpolation so that, as depicted in FIG. 5, the movement-corrected image data can be interpolated to a uniform grid.

FIG. 4 provides the option, in a method step CHECK, of selecting at least one k-space out of the number of k-spaces. The conversion of the combination of the first transformed k-space data set, the second transformed k-space data set and the third transformed k-space data set into the image domain in the further method step 51 can then exclude from consideration the selected at least one k-space data set. This enables outliers to be rejected during the movement correction.

FIG. 4 provides the further option of the provision of the movement-corrected magnetic resonance image data in the further method step 51 to be performed in a sliding-window method WINDOW. To this end, a first set of movement-corrected magnetic resonance image data is generated and made available using the combination of the first transformed k-space data set and the second transformed k-space data set converted into the image domain. Subsequently, second movement-corrected magnetic resonance image data are generated and made available using the combination of the first transformed k-space data set, the second transformed k-space data set and the third transformed k-space data set converted into the image domain. The provision of the second movement-corrected magnetic resonance image data takes place at a time after the provision of the first movement-corrected magnetic resonance image data.

The method steps of the method according to the invention depicted in FIG. 2-4 are carried out by the computer 24. To this end, the computer 24 has the necessary software and/or computer programs that are stored in a memory of the computer 24. The software and/or computer programs include program code designed to carry out the method according to the invention when executed in the computer 24.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for movement correction of magnetic resonance measurement data, comprising:
   operating a magnetic resonance data acquisition scanner so as to execute a magnetic resonance imaging procedure that includes executing a reference measurement at a first point in time during said magnetic resonance imaging procedure, wherein reference data are acquired from a reference region of an examination subject by the reference measurement;
   operating the data acquisition scanner in said magnetic resonance imaging procedure, at a time after said first point in time, to execute an image measurement wherein magnetic resonance measurement data sets are acquired respectively from a plurality of sub-regions of an examination region of the subject, including acquiring a first set of magnetic resonance measurement data from a first sub-region of said plurality of sub-regions, and acquiring a second set of magnetic resonance data from a second sub-region of said plurality of sub-regions;

entering said first set of magnetic resonance measurement data into a memory organized as k-space, as a first k-space data set, and entering said second set of magnetic resonance measurement data into said memory organized as k-space, as a second k-space data set;

providing said reference data and said first and second magnetic resonance measurement data sets to a computer and, in said computer, determining a first item of movement information, representing movement of the subject, from said reference region and said first set of magnetic resonance measurement data;

in said computer, determining a second item of movement information, also representing movement of the subject, from said reference region and said second set of magnetic resonance measurement data;

in said computer, transforming said first k-space data set by applying said first item of movement information to said first k-space data set, and thereby producing a first transformed k-space data set that has been individually movement-corrected by said first items of movement information;

in said computer, transforming said second k-space data set by applying the second item of movement information (e) to said second k-space data set, and thereby producing a second transformed k-space data set that has been individually movement-corrected by said second items of movement information;

in said computer, converting a combination of the first transformed k-space data set and the second transformed k-space data set into the image domain and thereby obtaining movement-corrected magnetic resonance image data; and from said computer, making the movement-corrected magnetic resonance image data available as an output in electronic form, as a data file.

2. A method as claimed in claim 1 comprising, in said computer, determining an item of movement information separately for each of said plurality of sub-regions from the reference region and the respective magnetic resonance measurement data for the respective sub-regions, and transforming a plurality of separate k-space data sets, respectively representing the magnetic resonance data acquired from the individual sub-slices, for each slice using the associated item of movement information, and converting the combination of the plurality of transformed k-space data sets into the image domain in order to obtain the movement-corrected magnetic resonance image data.

3. A method as claimed in claim 1 comprising converting the combination of the first transformed k-space data set and the second transformed k-space data set into the image domain by implementing an inverse non-uniform Fourier transformation.

4. A method as claimed in claim 1 comprising determining the first item of movement information from the reference region and the first set of magnetic resonance data by determining first rigid transformation parameters and using the first rigid transformation parameters to transform the first k-space data set, and determining the second item of movement information from the reference region and the second set of magnetic resonance measurement data by determining second rigid transformation parameters and using the second rigid transformation parameters to transform the second k-space data set.

5. A method as claimed in claim 1 comprising generating the first k-space data set by a Fourier transformation of said first set of magnetic resonance measurement data, and generating the second k-space data set by a Fourier transformation of said second set of magnetic resonance measurement data.

6. A method as claimed in claim 1 comprising generating said first item of movement information so as to describe a first movement of the object between said first point in time and the acquisition of said first set of magnetic resonance measurement data, and transforming the first k-space data set using said first item of movement information to compensate said first movement of said object in said first k-space data set, and generating said second item of movement information so as to described a second movement of the object between said first point in time and the acquisition of said second set of magnetic resonance measurement data, and transforming said second k-space data set using said second item of information to compensate the second movement of the object in the second k-space data set.

7. A method as claimed in claim 1 wherein said first k-space data set and said second k-space data set are mutually independent, autonomous k-space data sets.

8. A method as claimed in claim 1 comprising acquiring said magnetic resonance measurement data from said first sub-region to represent a first set of first slices of the examination region, and acquiring said magnetic resonance measurement data from said second sub-region so as to represent a second set of second slices of the examination region.

9. A method as claimed in claim 8 comprising operating said data acquisition scanner to acquire said magnetic resonance measurement data from said first slices and said second slices spatially interleaved with respect to each other.

10. A method as claimed in claim 8 wherein said first slices represent a first slice group, and operating said data acquisition scanner to acquire said magnetic resonance measurement data from said first slice group by coherently exciting said first slice group with a simultaneous multi-slice measuring technique, and wherein said second slices represent a second slice group and operating said data acquisition scanner to acquire said magnetic resonance measurement data from said second slice group by coherently exciting the second slice group with a simultaneous multi-slice measuring technique.

11. A method as claimed in claim 1 wherein, in addition to said first sub-region and said second sub-region, said examination region comprises a third sub-region, and operating said data acquisition scanner to acquire reference data and magnetic resonance measurement data from said third sub-region and, in said computer, determining a third item of movement information from the reference data and the magnetic resonance measurement data from the third sub-region, and transforming a third k-space data set, representing a third set of magnetic resonance measurement data, using said third item of movement information, and combining said first transformed k-space data set, said second transformed k-space data set and said third transformed k-space data set into the image domain in order to obtain said movement-corrected magnetic resonance image data.

12. A method as claimed in claim 11 comprising, in said computer, generating said movement-corrected magnetic resonance image data a first set of movement-corrected magnetic resonance image data generated using the combination of the first transformed k-space data set and the second transformed k-space data set into the image domain, and a second set of movement corrected magnetic resonance image data using the combination of the first transformed k-space data set, the second transformed k-space data set and the third transformed k-space data set converted into the image domain, and making the second movement corrected magnetic resonance image data available from the computer at a time after making the first movement-corrected magnetic resonance image data available from the computer.

13. A method as claimed in claim 11 comprising when converting the combination of the first transformed k-space data set, the second transformed k-space data set and the third transformed k-space data set into the image domain, excluding from the combination at least one of said first transformed k-space data set, said second transformed k-space data set and said third transformed k-space data set.

14. A method as claimed in claim 1 comprising operating said data acquisition scanner to execute said magnetic resonance imaging procedure according to first sequence parameters for executing said reference measurement and according to second sequence parameters for said image measurement, said magnetic resonance imaging procedure according to said first sequence parameters being less sensitive to movement of the object than said magnetic resonance imaging procedure according to said second sequence parameters.

15. A method as claimed in claim 1 comprising acquiring said reference data and said magnetic resonance measurement data from a brain region of the object by executing said magnetic resonance imaging procedure as a functional magnetic resonance sequence.

16. A method as claimed in claim 1 comprising generating said movement-corrected magnetic resonance image data to compensate for at least one of intensity fluctuations and intensity shift that occur due to the movement of the object.

17. A magnetic resonance apparatus comprising:
a magnetic resonance data acquisition scanner;
a computer configured to operate a magnetic resonance data acquisition scanner so as to execute a magnetic resonance imaging procedure that includes executing a reference measurement at a first point in time during said magnetic resonance imaging procedure, wherein reference data are acquired from a reference region of an examination subject by the reference measurement;
said computer being configured to operate the data acquisition scanner in said magnetic resonance imaging procedure, at a time after said first point in time, to execute an image measurement wherein magnetic resonance measurement data sets are acquired respectively from a plurality of sub-regions of an examination region of the subject, including acquiring a first set of magnetic resonance measurement data from a first sub-region of said plurality of sub-regions, and acquiring a second set of magnetic resonance data from a second sub-region of said plurality of sub-regions;
said computer being configured to enter said first set of magnetic resonance measurement data into a memory organized as k-space, as a first k-space data set, and entering said second set of magnetic resonance measurement data into said memory organized as k-space, as a second k-space data set;
said computer being configured to determine a first item of movement information, representing movement of the subject, from said reference region and said first set of magnetic resonance measurement data;
said computer being configured to determine a second item of movement information, also representing movement of the subject, from said reference region and said second set of magnetic resonance measurement data;
said computer being configured to transform said first k-space data set by applying said first item of movement information to said first k-space data set, and thereby producing a first transformed k-space data set that has been individually movement-corrected by said first items of movement information;
said computer being configured to transform a second k-space data set by applying the second item of movement information to said second k-space data set, and thereby producing a second transformed k-space data set that has been individually movement-corrected by said second items of movement information;
said computer being configured to convert a combination of the first transformed k-space data set and the second transformed k-space data set into the image domain and thereby obtaining movement-corrected magnetic resonance image data; and
said computer being configured to make the movement-corrected magnetic resonance image data available as an output in electronic form, as a data file.

18. A non-transitory, computer-readable data storage medium encoded with programming instructions, said storage medium being loaded into a control and evaluation computer of a magnetic resonance apparatus that comprises a magnetic resonance data acquisition scanner, said program code causing said control and evaluation computer to:
operate the magnetic resonance data acquisition scanner so as to execute a magnetic resonance imaging procedure that includes executing a reference measurement at a first point in time during said magnetic resonance imaging procedure, wherein reference data are acquired from a reference region of an examination subject by the reference measurement;
operate the data acquisition scanner in said magnetic resonance imaging procedure, at a time after said first point in time, to execute an image measurement wherein magnetic resonance measurement data sets are respectively acquired from a plurality of sub-regions of an examination region of the subject, including acquiring a first set of magnetic resonance measurement data from a first sub-region of said plurality of sub-regions, and acquiring a second set of magnetic resonance data from a second sub-region of said plurality of sub-regions;
enter said first set of magnetic resonance measurement data into a memory organized as k-space, as a first k-space data set, and entering said second set of magnetic resonance measurement data into said memory organized as k-space, as a second k-space data set;
determine a first item of movement information, representing movement of the subject, from said reference region and said first set of magnetic resonance measurement data;
determine a second item of movement information, also representing movement of the subject, from said reference region and said second set of magnetic resonance measurement data;
transform said first k-space data set by applying said first item of movement information to said first k-space data set, and thereby producing a first transformed k-space data set that has been individually movement-corrected by said first items of movement information;
transform said second k-space data set by applying the second item of movement information to said second k-space data set, and thereby producing a second transformed k-space data set that has been individually movement-corrected by said second items of movement information;

convert a combination of the first transformed k-space data set and the second transformed k-space data set into the image domain and thereby obtaining movement-corrected magnetic resonance image data; and make the movement-corrected magnetic resonance image data available as an output in electronic form, as a data file.

\* \* \* \* \*